United States Patent
Fargeas et al.

(10) Patent No.: US 11,878,338 B2
(45) Date of Patent: Jan. 23, 2024

(54) MOULD FOR MANUFACTURING A COMPONENT BY POURING METAL AND EPITAXIAL GROWTH, AND ASSOCIATED MANUFACTURING METHOD

(71) Applicant: SAFRAN AIRCRAFT ENGINES, Paris (FR)

(72) Inventors: Serge Alain Fargeas, Moissy-Cramayel (FR); Nicolas Romain Benjamin Leriche, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 172 days.

(21) Appl. No.: 17/610,954

(22) PCT Filed: Apr. 3, 2020

(86) PCT No.: PCT/EP2020/059628
§ 371 (c)(1),
(2) Date: Nov. 12, 2021

(87) PCT Pub. No.: WO2020/229055
PCT Pub. Date: Nov. 19, 2020

(65) Prior Publication Data
US 2022/0250137 A1    Aug. 11, 2022

(30) Foreign Application Priority Data

May 13, 2019 (FR) ........................ 1904936

(51) Int. Cl.
*B22D 27/04* (2006.01)
*B22C 9/00* (2006.01)
(Continued)

(52) U.S. Cl.
CPC .............. *B22C 9/06* (2013.01); *B22D 27/045* (2013.01); *C30B 11/002* (2013.01); *C30B 29/52* (2013.01)

(58) Field of Classification Search
CPC .. B22C 9/00; B22C 9/04; B22D 27/04; B22D 27/045; C30B 11/14
(Continued)

(56) References Cited

U.S. PATENT DOCUMENTS 4,714,101 A   12/1987   Terkelsen
4,966,645 A   10/1990   Shahid
(Continued)

FOREIGN PATENT DOCUMENTS

CN    200945520 Y    9/2007
CN    108411371 A    8/2018
(Continued)

OTHER PUBLICATIONS

International Search Report as issued in International Patent Application No. PCT/EP2020/059628, dated May 6, 2020.
(Continued)

*Primary Examiner* — Kevin P Kerns
(74) *Attorney, Agent, or Firm* — Pillsbury Winthrop Shaw Pittman LLP

(57) ABSTRACT

A mould for use in manufacturing a single-crystal component by metal casting and epitaxial growth, includes a cavity in which the component is to be formed and a housing having an elliptical cross-section in which a single-crystal seed is disposed, the seed having an elliptical cross-section defined by a minor axis and by a major axis, the housing being in fluid communication with the cavity via an opening of circular cross-section through which molten metal is to flow, the single-crystal seed and the opening being centred on the same vertical axis, in which the minor axis and the major axis of the cross-section of the seed are oriented as a function of the secondary crystallographic orientations of the single-crystal forming the single-crystal seed.

9 Claims, 4 Drawing Sheets

(51) Int. Cl.
*B22C 9/06* (2006.01)
*C30B 11/00* (2006.01)
*C30B 29/52* (2006.01)

(58) Field of Classification Search
USPC .................................. 164/122.1, 122.2, 361
See application file for complete search history.

(56) References Cited

U.S. PATENT DOCUMENTS

| | | |
|---|---|---|
| 2005/0211408 A1 | 9/2005 | Bullied et al. |
| 2008/0169076 A1* | 7/2008 | Aprile et al. ............. B22C 9/04 164/15 |
| 2010/0051142 A1 | 3/2010 | Boswell et al. |
| 2016/0079059 A1 | 3/2016 | Ayotte et al. |

FOREIGN PATENT DOCUMENTS

| | | |
|---|---|---|
| CN | 109695054 A | 4/2019 |
| EP | 0 171 343 A1 | 2/1986 |
| EP | 1 894 647 A1 | 3/2008 |
| EP | 2 092 999 A1 | 8/2009 |
| FR | 982 613 A | 6/1951 |
| FR | 3 042 725 A1 | 4/2017 |
| GB | 1 365 858 A | 9/1974 |
| GB | 1 515 543 A | 6/1978 |

OTHER PUBLICATIONS

Notice of Grant of Patent Right for Invention as issued in Chinese Patent Application No. 202080036046.2, dated Oct. 20, 2023.

\* cited by examiner

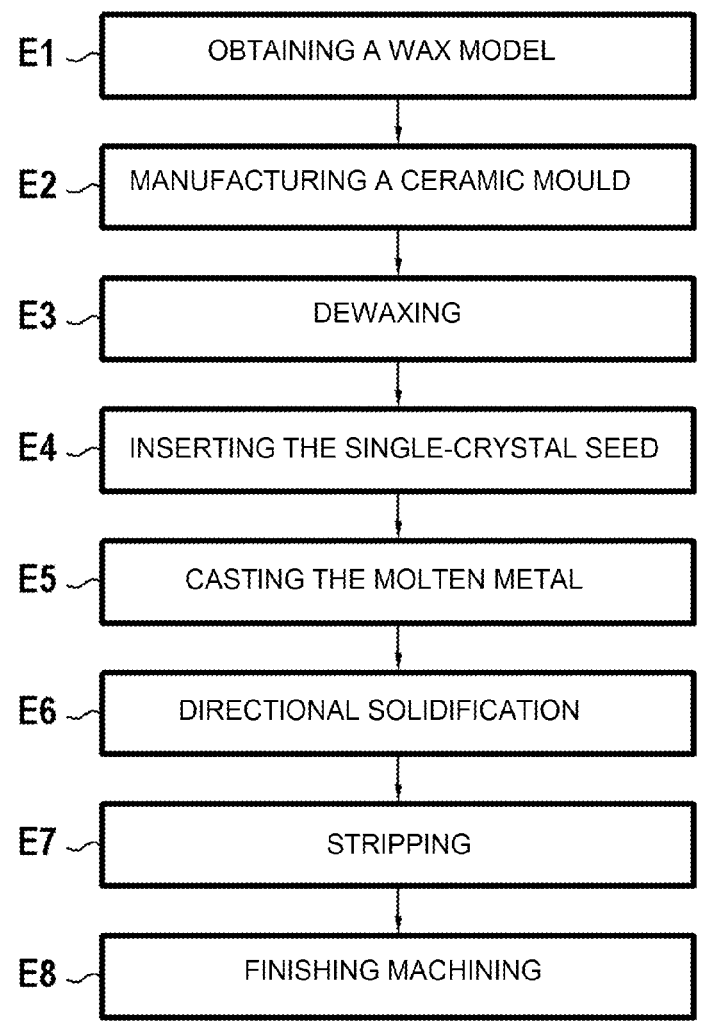
[Fig. 1]

[Fig. 2]
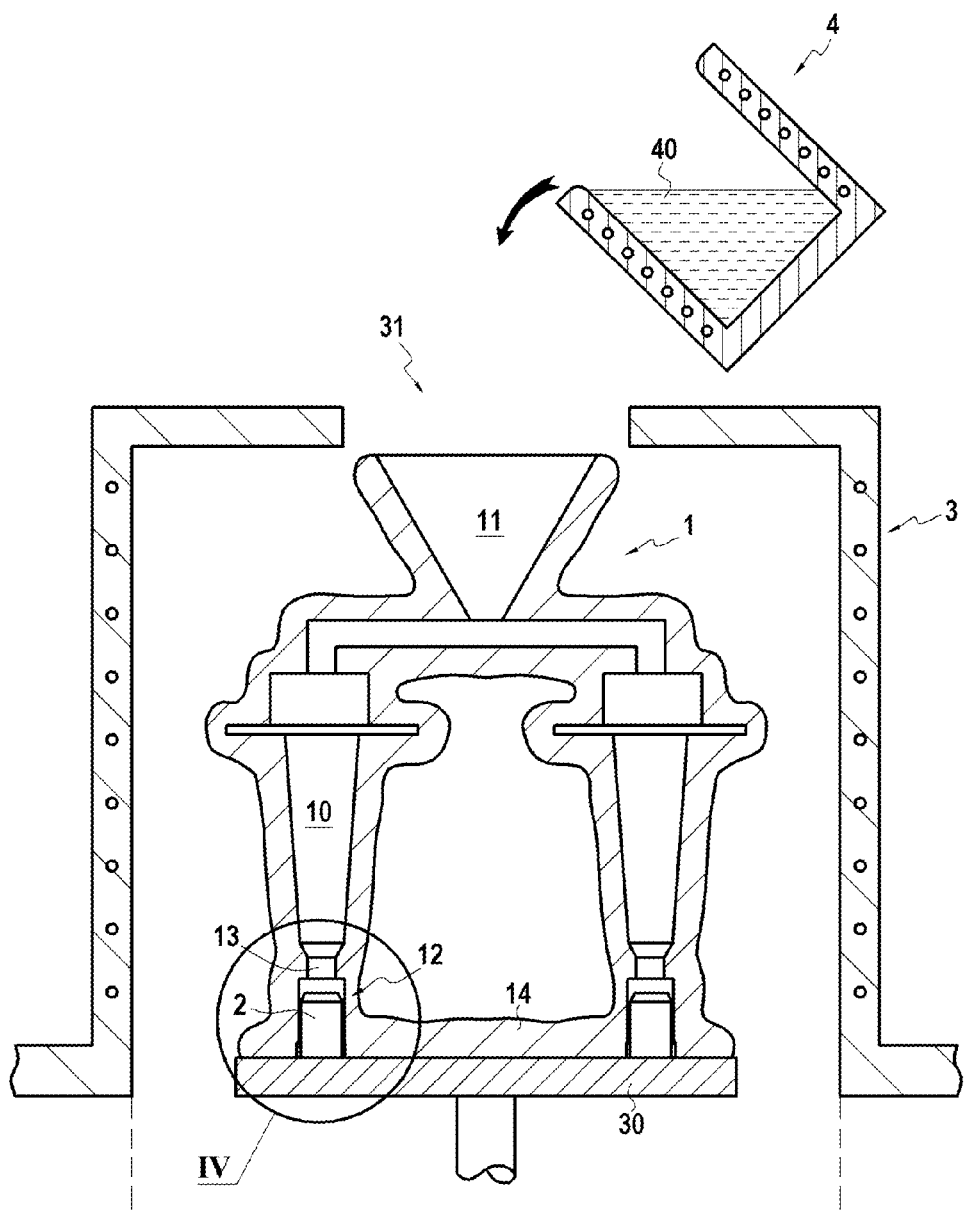

[Fig. 3]
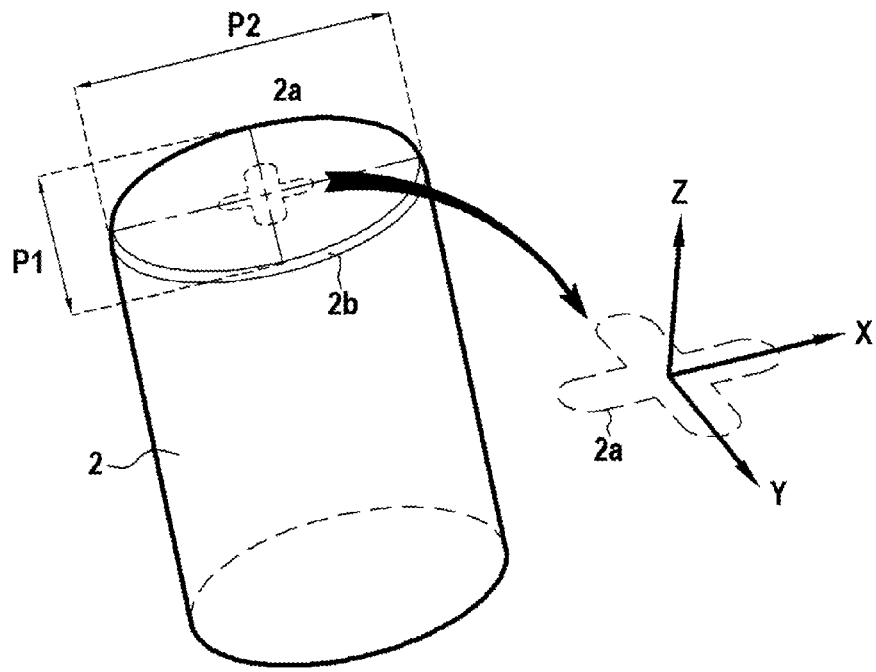
[Fig. 4]
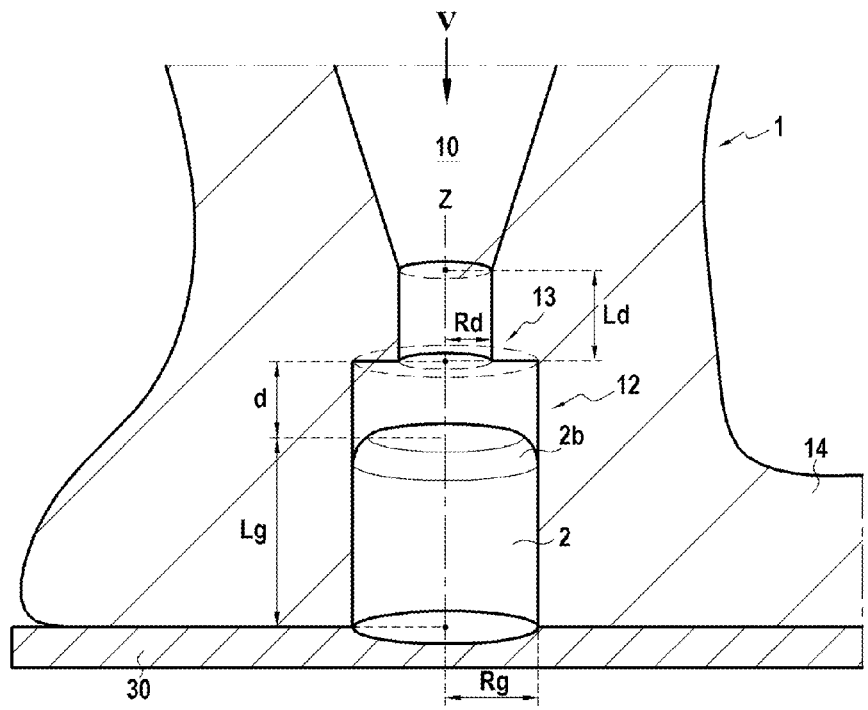

[Fig. 5]
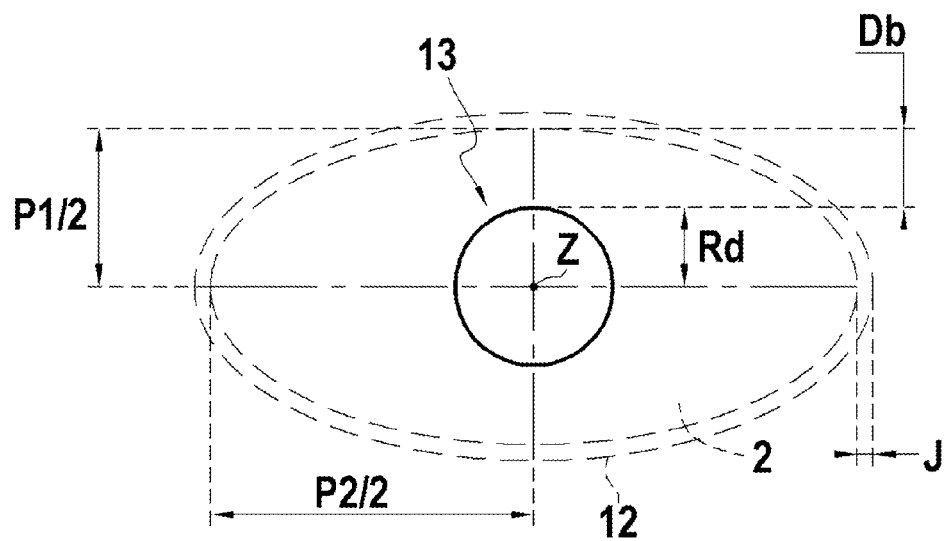

MOULD FOR MANUFACTURING A COMPONENT BY POURING METAL AND EPITAXIAL GROWTH, AND ASSOCIATED MANUFACTURING METHOD

CROSS-REFERENCE TO RELATED APPLICATIONS

This application is the U.S. National Stage of PCT/EP2020/059628, filed Apr. 3, 2020, which in turn claims priority to French patent application number 1904936 filed May 13, 2019. The content of these applications are incorporated herein by reference in their entireties.

TECHNICAL FIELD

The present invention relates to the general field of processes for manufacturing single-crystal components by metal casting. The present invention relates in particular to a mould for use in such processes.

PRIOR ART

In certain cases, and in particular in aeronautical turbomachines, it is necessary to have metal or metal alloy components with a controlled single-crystal structure. For example, in the turbine nozzles of aeronautical turbomachines, the vanes must withstand significant thermomechanical stresses due to the high temperature and centrifugal forces to which they are subjected. A controlled single-crystal structure in the metal alloys forming these vanes limits the effects of these stresses.

To produce a single-crystal component by metal casting, a ceramic mould can first be made from a model of the component to be produced (for example a wax model). A single-crystal seed (i.e., one with a known and constant crystallographic orientation throughout the seed) is placed in the mould, onto which the molten metal is poured and which then fills a cavity in the mould intended to form the component. During cooling, the metal solidifies and the epitaxial growth of the grains from the single-crystal seed ensures the crystallographic orientation in the cast component.

However, the seed can also be a source of defects in the component obtained by such a process. Indeed, the current seed configurations can lead to the growth of parasitic grains that propagate into the cast component.

Document FR 3 042 725 discloses a mould in which a cylindrical single-crystal seed is placed and whose dimensions are adapted to reduce the appearance of such parasitic grains. However, the single-crystal seed used must have an indexing element such as a pin on a lower portion thereof which is oriented according to a crystallographic orientation direction of the single-crystal seed. This indexing element is also a source of defects in the component obtained, as it may also be responsible for the appearance of parasitic grains at the time of directional solidification.

There is thus a need for a mould for manufacturing a component by metal casting and epitaxial growth, as well as a manufacturing process using such a mould, which do not have the above-mentioned disadvantages.

DISCLOSURE OF THE INVENTION

The invention relates to a mould for use in manufacturing a single-crystal component by metal casting and epitaxial growth, the mould comprising a cavity in which the component is to be formed and a housing having an elliptical cross-section in which a single-crystal seed is disposed, the seed having an elliptical cross-section defined by a minor axis and by a major axis, the housing being in fluid communication with the cavity via an opening of circular cross-section through which molten metal is to flow, the single-crystal seed and the opening being centred on the same vertical axis, wherein the minor axis and the major axis of the seed section respectively determine the secondary crystallographic orientations of the single-crystal forming the single-crystal seed.

Such a mould allows an easy indexing of the crystallographic directions of the single-crystal seed without the need of artifices such as a pin or a flat on a cylindrical seed, which would cause defects in the component. The elliptical shape of the seed also generates fewer defects than an oblong seed which has a flat side surface (and which is therefore not elliptical), in particular because of the difficulty of positioning it in the housing with a small clearance.

The secondary crystallographic orientations may be the <100> and <010> directions of the single-crystal forming the seed. In particular, the minor axis and major axis may coincide with said secondary crystallographic orientations, respectively, or optionally form a predetermined and known angle therewith.

In an example embodiment, the elliptical cross-section of the seed may have an eccentricity greater than or equal to 0.5 and less than 1. Such an eccentricity allows for easier location of crystallographic orientations and a reduced footprint compatible with complex mould geometries.

In an example embodiment, the elliptical cross-section of the seed may have an eccentricity comprised between 0.55 and 0.82.

In an example embodiment, a blocking distance corresponding to the difference between half the length of the minor axis of the seed section and a radius of the opening may be greater than or equal to 2.4 mm. The propagation of parasitic seeds is considerably reduced if the difference between the radii of the opening and half the minor axis of the seed is greater than or equal to 2.4 mm. This difference is referred to herein as the "blocking distance" as it is characteristic of the blocking of the propagation of parasitic grains in the component.

In an example embodiment, the clearance between the seed and a side surface of the housing may be less than or equal to 0.03 mm. A small clearance allows for proper positioning of the seed in the housing and also reduces the propagation of parasitic seeds.

In an example embodiment, the distance between a top surface of the seed and a top surface of the housing is comprised between 5 mm and 10 mm. Such a distance also reduces the propagation of parasitic grains while achieving proper epitaxy.

In an example embodiment, the single-crystal seed may have a chamfer or rounding around its top edge. "Top" is understood to mean the edge located on the side of the seed opposite the base on which it rests when the mould is in a vertical position. This rounding makes it possible to prevent a sharp edge from coming into contact with the mould and to remove small pieces of mould which could lead to the appearance of parasitic grains during the casting of the metal.

In an example embodiment, the mould may be intended to be used to manufacture a turbomachine vane. It may be an aeronautical turbomachine nozzle vane, for example.

In this case, the elliptical cross-section of the seed may have an eccentricity comprised between 0.55 and 0.82, the minor axis may have a length comprised between 13 mm and 16 mm, and the opening may have a radius comprised between 4 mm and 5 mm, and the distance between a top surface of the seed and a top surface of the housing may be comprised between 5 mm and 10 mm. This combination of parameters makes it possible to manufacture a turbomachine vane with a reduced number of defects related to parasitic grains and to obtain a robust mould.

The invention also relates to a process for manufacturing a single-crystal component by epitaxial growth, the process comprising the following steps:

manufacturing a mould comprising a cavity in which the component is to be formed, and a housing having an elliptical cross-section in which a single-crystal seed is disposed, the seed having an elliptical cross-section defined by a minor axis and by a major axis, the minor axis and the major axis of the cross-section of the seed being oriented as a function of the secondary crystallographic orientations of the single-crystal forming the single-crystal seed, the housing being in fluid communication with the cavity via an opening of circular cross-section through which molten metal is to flow, the single-crystal seed and the opening being centred on the same vertical axis, casting a molten metal into the mould, and directional solidification of the cast metal so as to obtain the component.

In an example embodiment, the single-crystal component to be manufactured may be an aeronautical component. "Aeronautical component" is understood to mean a component that can be used in a turbojet engine intended to propel an aircraft, such as an aeronautical turbomachine vane, a turbine ring, a low-pressure nozzle, an aeronautical combustion chamber injection system, an aeronautical injection system component, a flange, a clamping system, an engine equipment support, a cowling, etc.

BRIEF DESCRIPTION OF THE DRAWINGS

Other features and advantages of the present invention will emerge from the description below, with reference to the appended drawings which illustrate a non-limiting example embodiment thereof. In the figures:

FIG. 1 is a flowchart representing the various steps of a process according to the invention.

FIG. 2 is a schematic cross-sectional view of a mould according to the invention, disposed in a directional solidification furnace.

FIG. 3 shows a single-crystal seed for use in a mould according to an embodiment of the invention.

FIG. 4 is an enlarged view of FIG. 2 at a single-crystal seed housing.

FIG. 5 is a top view of the housing of a mould according to an embodiment of the invention.

DESCRIPTION OF THE EMBODIMENTS

The invention will now be described in the context of a process for manufacturing a single-crystal component by metal casting and epitaxial growth. In the illustrated example, the focus is on the manufacture of single-crystal aeronautical turbomachine nozzle vanes made of a metal alloy (for example, a nickel-based alloy such as the commercial alloy "AM1"). The steps of such a process are summarized in the flow chart of FIG. 1.

In a manner known per se, the first step of a manufacturing process by metal casting and epitaxial growth consists in obtaining a model, for example in wax, of the component to be manufactured (step E1).

The wax model is then covered with a ceramic shell (step E2), for example by successive dips in a suitable slurry and stuccoing in a ceramic powder. The shell-fitted model is then fired and decarbonized (step E3), i.e., the wax in the resulting ceramic mould is removed.

An example of a mould 1 according to the invention obtained from a wax model is illustrated in FIGS. 2 to 4. The ceramic mould 1 comprises in particular one or more cavities 10 (here two cavities are shown in FIG. 1) having the shape of the component to be manufactured (here an aeronautical turbomachine nozzle vane), which are open at their top ends and connected to one another by channels opening into a conical component, or cup 11. It is in the cup 11 that the metal will be subsequently cast before it reaches the cavities 10.

The mould 1 also comprises housings 12 into which single-crystal seeds 2 are inserted (step E4). There are typically as many housings 12 as there are cavities 10. A housing 12 is located below a cavity 10 and is in fluid communication with the cavity above it via an opening 13, so that liquid metal can be introduced from the cavity 10 into the housing 12. The channel connecting the opening 13 and the cavity 10 is here cylindrical in shape. It will be noted that the mould 1 is devoid of a helical-type grain selector duct.

The housing 12 and the single-crystal seed 2 are elliptical in shape (i.e., they have a constant elliptical cross-section over their entire height). The dimensions of the housing 12 and the seed 2 are close so as to leave as little clearance J (FIG. 5) as possible between the side wall of the housing 12 and the seed 2 to prevent liquid metal from seeping around the seed 2 during casting and generating parasitic grains during the solidification of the metal. This clearance J may be less than or equal to 0.03 mm.

At the base of the mould 1 is a base 14 which holds the seed 2 in the housing 12, and which also supports the whole mould 1 when it is in a vertical position.

The seed 2, shown in perspective in FIG. 3, has an elliptical cross-section with a minor axis P1 and a major axis P2. A dendrite 2a is shown in dashed lines on the top surface of the seed, schematizing the secondary crystallographic orientations of the single-crystal forming the seed 2. The dendrite thus defines a direction X corresponding to crystallographic orientation <100>, a direction Y corresponding to orientation <010>, and a direction Z perpendicular to the directions X and Y corresponding to orientation <001>. In this example, the minor axis P1 and major axis P2 coincide with the directions Y and X, respectively. The eccentricity of the ellipse defining the seed 2 (as well as the housing 12) is preferably comprised between 0.5 and 1 (exclusive), and even more preferentially comprised between 0.55 and 0.82 for the application envisaged. Here, the seed 2 has a rounding 2b around its top edge. Alternatively, the seed plate 2 may have a chamfer instead of a rounding. Typically, the seed 2 does not completely occupy the housing 12, and a space is provided between the top end of the seed 2 and the opening 13 into which liquid metal may be poured.

FIG. 4 shows a detailed view of a housing 12 in which a seed 2 is disposed. The seed 2 and the opening 13 are centred on the same vertical axis Z.

The seed cell 2 has a length Lg, which is, for example, comprised between 40 and 45 mm. The half length Rg of the seed 2 along the major axis P2 is shown in FIG. 4. The opening 13 (or the top wall of the housing 12) may be separated from the top surface of the seed 2 by a distance d comprised between 5 mm and 10 mm to achieve proper epitaxy. The opening 13 may for example extend over a length Ld of the order of 5 mm. Preferably, the radius of the opening Rd is greater than or equal to 4 mm to reduce the impact of the opening on the strength of the mould 1. Even more preferably, the radius of the opening Rd is less than or equal to 5 mm, to ensure correct filling of the mould 1 by the molten metal. The minor axis P1 of the seed 2 may have a length greater than 13 mm in order to increase the reliability of the mould 1.

A blocking distance Db (FIG. 5) is defined as the difference between the minor axis (P1)/2 of the seed and the radius of the opening Rd: Db=(P1)/2−Rd. This blocking distance is a characteristic quantity of the propagation of parasitic grains from the seed housing 12 to the cavity 10. The blocking distance Db can be greater than or equal to 2.4 mm to ensure better blocking of parasitic grains. Item "P1/2" in FIG. 5 represents the half length of the seed along the minor axis P1. Item "P2/2" in FIG. 5 represents the half length of the seed along the main axis P2.

Once the seeds 2 have been inserted and oriented in their housings 12, the entire mould 1 on its base 14 is placed on a movable plate 30 of a directional solidification furnace 3. Advantageously, the furnace 3 has a top window 31 through which metal can be poured into the mould 1. The movable plate 30 allows the mould 1 to be quickly removed from the hot enclosure of the furnace 3 to regulate its temperature. The plate 30 may be a cooled copper plate. The seeds 2 may be fixed, for example, by gluing to the plate 30.

The mould 1 is heated in the furnace 3, and liquid metal 40 is poured from a crucible 4 into the mould 1 (step E5), through the furnace window 31. The housings 12 of the seeds 2 are filled with metal, followed by the cavities 10 in which the components are formed. The mould 1 is gradually removed from the furnace 3, for example by lowering the movable plate 30, in order to reduce the temperature of the mould 1 and to control the solidification of the metal in the mould (step E6).

During the directional solidification, the metal grain will grow by epitaxy from the seed, whose crystallographic orientation is well known and controlled. By respecting the particular dimensions of the mould according to the invention, the growth of parasitic grains whose orientation is not controlled is avoided, and components with a controlled monocrystalline structure are obtained after stripping.

After the mould has been stripped (step E7), conventional finishing machining (step E8) can be carried out to obtain the finished single-crystal components.

In the course of a test, turbomachine vanes made of nickel-based metal alloy AM1 were cast in a mould such as the mould 1 shown in FIGS. 2 and 3, made of ceramic. The eccentricity of the ellipses defining the seed 2 and the housing 12 is of the order of 0.75, the radius of the opening is of the order of 4.5 mm, the minor axis has a length of 14.5 mm, and the distance separating the top surface of the seed 2 and the top surface of the housing is 6 mm. The temperature of the furnace for carrying out the casting and the directional solidification is, in this example, between 1480° C. and 1600° C. The mould produced is robust, and the vanes obtained have fewer defects related in particular to the propagation of parasitic grains than when a cylindrical seed with a flat is used.

The invention claimed is:

1. A mould for use in manufacturing a single-crystal component by metal casting and epitaxial growth, the mould comprising a cavity in which the component is to be formed and a housing having an entire elliptical cross-section in which a single-crystal seed is disposed, the single-crystal seed having an elliptical cross-section defined by a minor axis and by a major axis, the housing being in fluid communication with the cavity via an opening of circular cross-section through which molten metal is to flow, the single-crystal seed and the opening being centred on a same vertical axis, wherein the minor axis and the major axis of the elliptical cross-section of the single-crystal seed respectively determine secondary crystallographic orientations of the single-crystal forming the single-crystal seed, and wherein the elliptical cross-section of the single-crystal seed has an eccentricity greater than or equal to 0.5 and less than 1.

2. The mould as claimed in claim 1, wherein the elliptical cross-section of the single-crystal seed has an eccentricity comprised between 0.55 and 0.82.

3. The mould as claimed in claim 1, wherein a blocking distance corresponding to a difference between half a length of the minor axis of the elliptical cross-section of the single-crystal seed and a radius of the opening is greater than or equal to 2.4 mm.

4. The mould as claimed in claim 1, wherein a clearance between the single-crystal seed and a side surface of the housing is less than or equal to 0.03 mm.

5. The mould as claimed in claim 1, wherein a distance between a top surface of the single-crystal seed and a top surface of the housing is comprised between 5 mm and 10 mm.

6. The mould as claimed in claim 1, wherein the single-crystal seed has a chamfer or rounding around its top edge.

7. The mould as claimed in claim 1, wherein said mould is adapted to manufacture a turbomachine vane.

8. The mould as claimed in claim 7, wherein the elliptical cross-section of the single-crystal seed has an eccentricity comprised between 0.55 and 0.82, the minor axis has a length comprised between 13 mm and 16 mm, the opening has a radius comprised between 4 mm and 5 mm, and a distance between a top surface of the single-crystal seed and a top surface of the housing is comprised between 5 mm and 10 mm.

9. A process for manufacturing a single-crystal component by epitaxial growth, the process comprising:

manufacturing a mould comprising a cavity in which the component is to be formed, and a housing having an entire elliptical cross-section in which a single-crystal seed is disposed, the single-crystal seed having an elliptical cross-section defined by a minor axis and by a major axis, the minor axis and the major axis of the elliptical cross-section of the single-crystal seed being oriented as a function of secondary crystallographic orientations of the single-crystal forming the single-crystal seed, wherein the elliptical cross-section of the single-crystal seed has an eccentricity greater than or equal to 0.5 and less than 1, the housing being in fluid communication with the cavity via an opening of circular cross-section through which molten metal is to flow, the single-crystal seed and the opening being centred on a same vertical axis, casting the molten metal into the mould, and directional solidification of the cast metal so as to obtain the component.

* * * * *